United States Patent
Young et al.

(10) Patent No.: US 6,851,705 B2
(45) Date of Patent: **\*Feb. 8, 2005**

(54) DUAL OUTPUT INFLATOR WITH INDEPENDENT GAS STORAGE VESSELS

(75) Inventors: Anthony M. Young, Malad, ID (US); David J. Green, Brigham City, UT (US)

(73) Assignee: Autoliv ASP, Inc., Ogden, UT (US)

( * ) Notice: Subject to any disclaimer, the term of this patent is extended or adjusted under 35 U.S.C. 154(b) by 109 days.

This patent is subject to a terminal disclaimer.

(21) Appl. No.: 10/298,766

(22) Filed: Nov. 18, 2002

(65) Prior Publication Data

US 2003/0062713 A1 Apr. 3, 2003

Related U.S. Application Data

(63) Continuation-in-part of application No. 10/100,820, filed on Mar. 19, 2002, and a continuation-in-part of application No. 10/100,855, filed on Mar. 19, 2002, and a continuation-in-part of application No. 10/115,857, filed on Apr. 3, 2002.

(51) Int. Cl.[7] ............................................. B60R 21/26
(52) U.S. Cl. .................... 280/729; 280/737; 137/68.13
(58) Field of Search ............................... 280/737, 736, 280/741, 730.2, 730.1, 749, 729; 137/68.13; 102/530, 531

(56) References Cited

U.S. PATENT DOCUMENTS

| | | | | |
|---|---|---|---|---|
| 4,796,912 A | * | 1/1989 | Lauritzen et al. | 280/736 |
| 4,919,897 A | * | 4/1990 | Bender et al. | 280/736 |
| 5,058,921 A | * | 10/1991 | Cuevas | 280/736 |
| 5,225,940 A | | 7/1993 | Ishii et al. | 359/823 |
| 5,301,979 A | * | 4/1994 | Allard | 280/737 |
| 5,593,180 A | | 1/1997 | Cuevas et al. | 280/741 |
| 5,630,619 A | | 5/1997 | Buchanan et al. | 280/741 |
| 5,709,406 A | | 1/1998 | Buchanan | 280/737 |
| 5,762,369 A | | 6/1998 | Mooney et al. | 280/741 |
| 5,820,161 A | | 10/1998 | Svensson | 280/737 |
| 5,863,066 A | * | 1/1999 | Blumenthal | 280/737 |
| 5,951,043 A | | 9/1999 | Mooney et al. | 280/741 |
| 6,095,561 A | * | 8/2000 | Siddiqui et al. | 280/741 |
| 6,293,581 B1 | | 9/2001 | Saita et al. | 280/730.2 |
| 6,454,299 B2 | * | 9/2002 | Whang et al. | 280/736 |
| 6,543,804 B2 | * | 4/2003 | Fischer | 280/736 |
| 2003/0042719 A1 | * | 3/2003 | Rink et al. | 280/736 |

FOREIGN PATENT DOCUMENTS

| | | | |
|---|---|---|---|
| DE | 19701663 | 7/1998 | ........... B60R/21/26 |
| DE | 199 30 239 | 1/2001 | |
| DE | 100 40 822 | 4/2001 | |
| DE | 101 38 245 | 5/2002 | |
| EP | 0 949 126 | 10/1999 | |
| JP | 2000-296751 | 10/2000 | ........... B60R/21/22 |
| WO | WO99/32334 | 7/1999 | ........... B60R/21/26 |

* cited by examiner

*Primary Examiner*—Peter C. English
(74) *Attorney, Agent, or Firm*—Sally J. Brown

(57) ABSTRACT

An airbag inflator having two individual sections coupled together by a connection member is disclosed. The vessel may be configured to have different airbag inflation characteristics. The sections may have different gas generants, volumes, and orifice sizes. The inflator may also include modular components. Various vessels having different inflation characteristics may be attached to a connection member. The use of modular components allows multiple inflator configurations to be created from a smaller number of components.

58 Claims, 5 Drawing Sheets ly. The present invention relates to systems and methods for
DUAL OUTPUT INFLATOR WITH INDEPENDENT GAS STORAGE VESSELS

RELATED APPLICATIONS

This application is a continuation-in-part of co-pending patent applications: Ser. No. 10/100,820 filed Mar. 19, 2002 and entitled DUAL FLOW INFLATOR FOR A VEHICULAR AIRBAG SYSTEM; Ser No. 10/100,855 filed Mar. 19, 2002 and entitled INFLATABLE CURTAIN MODULE FOR USE IN VEHICLE; and Ser. No. 10/115,857 filed Apr. 3, 2002 and entitled BIAXIAL FLOW INFLATOR WITH INDEPENDENTLY ADJUSTED GAS ORFICES; all of which are incorporated herein by reference.

BACKGROUND OF THE INVENTION

1. Field of the Invention

The present invention relates to systems and methods for protecting vehicle occupants from injury. More specifically, the present invention relates to a dual flow inflator that injects multiple gas flows into an airbag system, such as an inflatable curtain.

2. Description of Related Art

The inclusion of inflatable safety restraint devices, or airbags, is now a legal requirement for many new vehicles. Airbags are typically installed in the steering wheel and in the dashboard on the passenger side of a car. In the event of an accident, an accelerometer within the vehicle measures the abnormal deceleration and triggers the expulsion of rapidly expanding gases from an inflator. The expanding gases fill the airbags, which immediately inflate in front of the driver and passenger to protect them from impact against the windshield. Side impact airbags, known as inflatable curtains, have also been developed in response to the need for protection from impacts in a lateral direction, or against the side of the vehicle. An inflatable curtain may have one or more separately inflated cushions.

Side impact cushions are often designed to unfold or unroll downward to inflate beside a person to keep the person from hitting the door or window during lateral impact. Since a vehicle occupant may be leaning forward, reclined in the seat, or at any position between, such cushions are often made somewhat long to ensure that the occupant hits the cushion. If multiple cushions are fed by a single inflator positioned either fore or aft of the cushions, an especially long gas flow path exists between the inflator and the cushion furthest from the inflator. Thus, the outermost extents of the inflatable curtain may receive insufficient inflation gas pressure to inflate to the optimal protective pressure.

Even with somewhat shorter cushions, rapid and even inflation can be difficult to achieve with known inflator designs. Many existing inflators eject inflation gases outward radially; consequently, the inflation gases are not propelled along the length of the cushion, but are directed into the cushion near the inflator. The outer regions of the cushion are still inflated later than those closest to the inflator.

Additionally, some inflatable curtain systems are somewhat expensive due to the need for multiple inflators, attachment mechanisms, and the like. Many inflatable curtain systems require the use of a gas conduit that conveys gas from the inflator to the inflatable curtain. Some known inflators require the use of multiple initiators that add to the manufacturing expense and timing requirements of the inflator.

Furthermore, many inflators produce thrust upon activation. As a result, somewhat complex attachment mechanisms must often be used to affix the inflators to the vehicle to ensure that the inflators do not dislodge themselves during deployment. Such additional parts increase the cost of the inflatable curtain system, as well as the time and expense required to install the inflatable curtain system in a vehicle.

Yet another shortcoming of current inflator designs is the difficulty of customizing the inflator for attachment to inflatable curtains of varying types and sizes. For example, an SUV may require two generally large inflatable curtains for each of the front and rear seats. However, a sports car may require a medium-sized inflatable curtain for the front seat and a small inflatable curtain for the rear seat. In order to accommodate different inflatable curtain requirements, unique inflator configurations are needed in for different vehicles.

Accordingly, a need exists for an inflator and related methods that remedy the problems found in the prior art. Such an inflator should preferably provide relatively even and rapid inflation of the associated inflatable curtain, preferably without requiring multiple inflators for a single curtain. Such an inflator should also preferably be simple and inexpensive to manufacture and install.

Furthermore, it would be an improvement in the art to provide an inflator that could simultaneously inflate two differently sized inflatable curtains. It would be a further improvement in the art to provide an inflator capable of inflating two differently sized inflatable curtains, while still remaining substantially thrust neutral. Another improvement in the art would be to provide an inflator module capable of receiving differently sized gas vessels that can be customized for an individual automobile. Such an inflator and inflatable curtain system is disclosed herein.

SUMMARY OF THE INVENTION

The apparatus of the present invention has been developed in response to the present state of the art, and in particular, in response to the problems and needs in the art that have not yet been fully solved by currently available inflators. Thus, it is an overall objective of the present invention to provide an inflator and related systems and methods that provides rapid, even inflation with independently configurable vessels.

One aspect of the invention includes an airbag inflator having a first vessel and a second vessel. Each of the vessels contains a gas generant for inflating an inflatable curtain. The two vessels are not in fluid communication. The gas generant may be injected into an inflatable curtain through ejection orifices present in each of the vessels. The two vessels are attached together by a connection member such that the ejection orifices eject gas in generally opposite directions. The vessels may each be independently attached to a separate inflatable airbag or attached to individual portions of a single airbag, among other configurations. This vessels may be coupled to the airbag such that gas produced by the gas generant travels freely into the airbag or airbags.

In one configuration, the first vessel and the second vessel are coaxial, providing for a generally elongated biaxial inflator. By positioning the two vessels coaxially, the thrust generated by the vessels will be expelled in substantially opposite directions. When the thrusts generated by the vessels are in substantially opposite directions, the forces generated by the thrusts are also in opposite directions, such that the two thrusts neutralize each other. Thus, by positioning the two vessels such that their respective ejection orifices are oriented to eject gas in generally opposite directions, the inflator may be made to be substantially thrust neutral.

The use of two separate vessels further allows the characteristics of each of the vessels to be independently selectable. For example, the first vessel may contain a larger amount of gas generant than the second vessel. The difference in the amounts of gas generants may correspond to differing sizes of inflatable curtains to which the individual vessels are attached. The vessels may also be different volumes and sizes to accommodate different amounts of gas generant or to accommodate size restrictions within the vehicle.

The individual vessels may be separate members that are coupled together by a connection member. The attachment of the members may be accomplished through welding or other similar processes. Alternatively, the individual vessels may be part of a generally elongated chamber that is divided into different vessels. The vessels may be divided and defined by a plurality of burst disks located in the elongated chamber to prevent fluid communication between the vessels. Burst disks may also be employed to seal the vessels so that the vessels can be independently attached to the connection member in a filled state.

A burst disk is a generally thin plate that inhibits fluid communication. A burst disk may have a sealed configuration and an open configuration. In the sealed configuration, the burst disks maintain the gas or gas generants within the vessels. In the open configuration, the burst disks allow the gas or gas generant to exit the vessels in gaseous form.

The burst disks may be opened from the sealed configuration by an initiator in communication with the connection member. The initiator may be a pyrotechnic device coupled to an impact detection system. Upon detecting rapid deceleration, the initiator is triggered. The triggering of the initiator causes the burst disks to open and allows a gas to be ejected from the vessels.

Other mechanisms for sealing the vessels from each other are also provided. The vessels may include displaceable pistons position between the vessels and the connection member. Displaceable pistons are configured to compress the gas or gas generants within the vessels when the initiator is triggered. The compression of the gas or gas generants within the vessels will increase the pressure within the vessels. The ejection orifices may be sealed by burst disks or some other pressure-sensitive sealing mechanism. As the pressure increases within the vessel, the burst disks, or other mechanisms sealing the ejection orifices, open.

A similar function may be accomplished through toggling disks. A toggling disk may be a dome-shaped disk that is bowed inward toward the connection member. Upon activation of the initiator, the toggling disks are forced from the bowed inward orientation to a bowed outward orientation relative to the connection member. As the toggling disks bow outward from the connection member and bow inward toward the vessels, the toggling disks apply a compressive force on the gas or gas generants within the vessels, such that the ejection orifices open.

The present invention also includes an inflator module that can be assembled through various stock vessel components. The vessels may be selectable from different groups that provide a variety of sizes, gas or gas generants, ejection orifice sizes, etc. The vessels may have threaded or detent attachment ends, such that the vessels are attachable to a standardized connection member having attachment ends corresponding to the vessels' attachment ends. By employing multiple different vessels, an inflator module may be created according to the needs of a specific vehicle from a number of stock inflator components.

These and other features and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other features and advantages of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The presently preferred embodiments of the present invention will be best understood by reference to the drawings, wherein like parts are designated by like numerals throughout. It will be readily understood that the components of the present invention, as generally described and illustrated in the figures herein, could be arranged and designed in a wide variety of different configurations. Thus, the following more detailed description of the embodiments of the apparatus, system, and method of the present invention, as represented in FIGS. 1 through 5, is not intended to limit the scope of the invention, as claimed, but is merely representative of presently preferred embodiments of the invention.

The present invention provides an apparatus whereby problems associated with previously known inflators can be resolved. More specifically, through the use of counterbalancing axial flows, a substantially thrust neutral design may be obtained, thereby eliminating the complexity of axially-supported inflator mounting. Furthermore, the invention provides for an inflator with two independently-configurable vessels to provide the counterbalancing axial flow. The inflator is further capable of initiating gas flow from two independent vessels with the single initiator. The two independent vessels may have different sizes, volumes, gases or gas generants, orifice sizes, etc. The two vessels are further configured to inject inflation gas into multiple inlet ports in an inflatable curtain to enhance the speed and controllability of curtain deployment.

As used herein, the term "gas generant" is used to encompass gases or materials that produce gases for expulsion from the inflator. Thus, gas generants may be pyrotechnic materials that generate a gas in a chemical reaction, pressurized gases which expand to produce the inflation gases, gases which dissociate to produce the inflation gases, liquefied gases, or any combination of these.

Additionally, the invention provides for simultaneous inflation of multiple inflatable curtains having different volumes through the independently-configurable vessels. A modular inflator is also provided, where the inflator may be designed for a specific automobile through the use of multiple stock vessels, connection members, and initiators. Hence, various types and sizes of inflatable curtains can be made to deploy more evenly to provide better occupant protection. The manner in which these principles are utilized in the present invention will be shown and described in greater detail in the following discussion.

Figure 1:
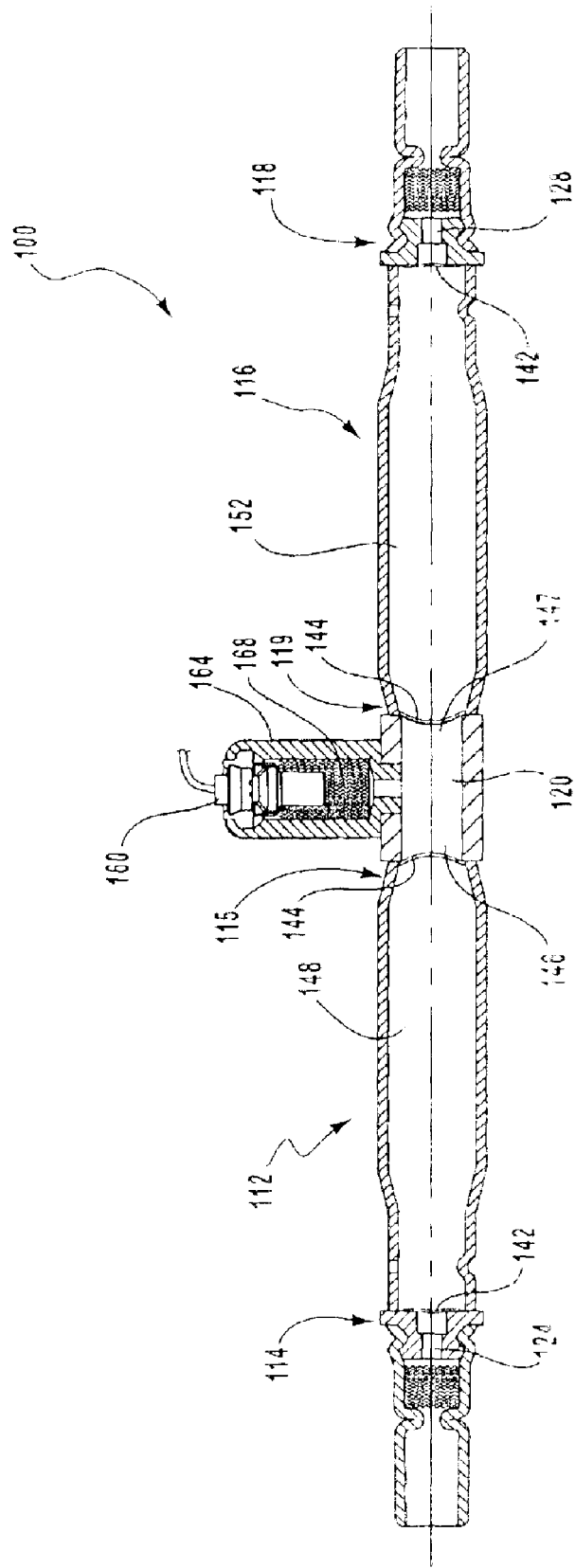
FIG. 1 is a cross-sectional view of one embodiment of an inflator according to the present invention.

Referring to FIG. 1, a side elevation, cross-sectional view of an inflator 100 is shown, according to one embodiment of the invention. The inflator 100 comprises a first vessel 112 and a second vessel 116 that are coupled together to form an inflator 100 for ejecting two counterbalancing axial flows of inflation gas into an inflatable curtain. The two vessels 112, 116 may be formed of a material with a comparatively high tensile strength, such as steel. The two vessels 112, 116 may be made from multiple pieces that are welded or otherwise attached together to provide the configuration shown in FIG. 1. In the alternative, two vessels 112, 116 may be formed of a single, unitary piece of material that is divided into multiple vessels 112, 116. The inflator 100 may further have a generally tubular shape.

The first vessel 112 has a first end 114 and a second end 115, where an ejection orifice 124 is present at the first end 114 of the first vessel 112. Similarly, the second vessel 116 has a first end 118 and a second end 119, where an ejection orifice 128 is present at the first end 118 of the second vessel 116. Each of the ejection orifices 124, 128 has an open configuration, in which inflation gas can pass relatively freely through the ejection orifices 124, 128, and a sealed configuration, in which substantially all inflation gasses are trapped within the vessels 112, 116.

The first vessel 112 and the second vessel 116 are coupled together at the second ends 115, 119 by a connection member 120. The connection member 120 may attach to the vessels 112, 116 such that the vessels 112, 116 are coaxially aligned to one another and where the ejection orifices 124, 128 of the vessels 112, 116 are oriented to eject inflation gas in substantially opposite directions. The substantially opposite directions need not necessarily be directly opposite on a single axis. Rather, substantially opposite directions include a wide number of diverging directions, where the inflation gases are ejected in opposite directions along at least one of the three Cartesian axes.

By orienting the coaxial ejection orifices 124, 128 in opposite and diverting directions, the thrust generated by gas ejecting from the first vessel 112 may neutralize the thrust generated by gas ejecting from the second vessel 116. Hence, the inflator 100 will be subject to substantially no thrust in the direction of ejecting inflation gas.

As a result, the inflator 100 may be attached to an automobile with only minimal support against axial motion of the inflator 100. Such a substantially thrust neutral configuration eliminates the need for bulky and complex attachment mechanisms for supporting the inflator 100. Thus, the area required to store and attach the inflator 100 may be minimized and the cost may be reduced.

While the inflator 100 is substantially thrust neutral when the ejection orifices 124, 128 are coaxially aligned, the inflator 100 may provide a reduced thrust for embodiments not employing coaxial ejection orifices 124, 128. In a non-coaxial configuration, the thrust generated by gas ejecting from the ejection orifices 124, 128 will not completely neutralize one another. Thus, the thrust of the inflator 100 will be equal to the difference between the thrust vectors of the ejection gases in any one direction. However, the difference between the thrust magnitudes generated by each ejection orifice 124, 128 will be substantially smaller than the thrust generated by any one of the single ejection orifices 124, 128.

The present invention provides for an inflator 100 employing two vessels 112, 116 not in fluid communication. The two separate vessels 112, 116 may be varied from each other in the same manner as two separate inflators may vary. Thus, multiple embodiments may exist where the magnitude of the thrust ejecting from each of the ejection orifices 124, 128 is not equal. However, as stated above, the magnitude of the thrust will only be the difference between the magnitude of the thrust generated by each ejection orifice 124, 128.

Because the present invention includes an inflator 100 having two separate vessels 112, 116, the separate vessels 112, 116 may be individually varied to control the characteristics of gas ejecting from each of the ejection orifices 124, 128. For example, the vessels 112, 116 may have differing gases or gas generants, gas flow rates, vessel sizes, among some varying features. Thus, the individual characteristics of the vessels 112, 116 may be varied according to the required function of the inflator 100. The possible variations of the vessels 112, 116 will be discussed in detail throughout the application.

Various configurations of the inflator 100 are possible to allow the first vessel 112 and the second vessel 116 to be independently configurable. In one embodiment, the first vessel 112 and second vessel 116 are independent members that are attached together by a connection member 120. The two vessels 112, 116 may be similar to two separate inflators that are attached together by the connection member 120. In the alternative, the first vessel 112 and the second vessel 116 may be part of a unitary inflator body where the individual vessels 112, 116 are defined by ejection orifice burst disks 142 and connection orifice burst disks 144. The ejection orifice burst disks 142 and the connection member burst disks 144 segregate sections of the inflator 100 to establish the independently configurable vessels 112, 116.

Burst disks 142, 144 are generally thin plate-like sections configured to seal openings in the inflator 100 and vessels 112, 116. In the inflator illustrated in FIG. 1, the burst disks 142, 144 are employed to seal the ejection orifices 124, 128 and the connection member orifices 146, 147. The ejection orifice burst disks 142 seal the ends 114, 118 of the inflator 100 to prevent the gases or gas generants 148, 152 from exiting the inflator 100. The connection member burst disks 144 seal the connection member orifices 146, 147 to prevent the gases or gas generants 148, 152 from entering the connection member 120. The connection member burst disks 144 also prevent fluid communication of the gases or gas generants 148, 152 between the two vessels 112, 116.

The burst disks 142, 144 may have a slightly domed shape caused by the pressure of the gases or gas generants 148, 152 applying a force on the burst disks 142, 144. The dome shape deflection of the burst disks 142, 144 operates similar to a bulkhead to maintain pressurized gases or gas generants 148, 152 in the vessels 112, 116. The size and thickness of the burst disks 142, 144 may vary depending on the sizes of the orifices 124, 128, 146, 147 and depending on the pressures of the gases or gas generants 148, 152.

The burst disks 142, 144 are preferably shaped to deflect under a pressure increase to open the orifices 124, 128, 146, 147. For example, the burst disks 142 may be made to bend enough to fit through the ejection orifices 124, 128, so that the pressure increase ejects the burst disks 142 from the sealing position on the ejection orifices 124, 128. The burst disks 142, 144 may simply have a pressure threshold above which sufficient deformation occurs to push the burst disks 142, 144 through the orifices 124, 128, 146, 147. Alternatively, the burst disks 142, 144 may deform primarily in response to shock, or rapid pressure changes within the inflator 100.

The orifices 124, 128, 146, 147 may have a counterbored shape with the larger portion disposed inward, toward the burst disk 142, 144, and the narrower portion disposed outward, as illustrated by the ejection orifices 124, 128 of FIG. 1. By way of example, the larger portion of the ejection orifices 124, 128 may be sized to promote deflection and passage of the burst disks 142, 144 through the ejection orifices 124, 128 when the proper pressure or shock is achieved within the inflator 100. The narrower portion of the ejection orifices 124, 128 may serve as a flow restrictor to meter the flow of inflation gas from the ejection orifices 124, 128.

Depending on the configuration of the burst disk 142, 144, the desired flow rate of inflation gas upon deployment, and other factors, the larger and narrower portions may be switched such that the larger portion is inwardly disposed and the smaller portion is outwardly disposed. Alternatively, the counterbore may be eliminated entirely in favor of orifices 124, 128, 146, 147 of uniform diameter.

As stated previously, the burst disks 142, 144 may be opened by an increase in pressure within the vessel 112, 116 or opened by a shock wave produced in the inflator 100. The increase in pressure or shock wave may be created by an initiator 160 communicatively coupled to the connection member 120.

An initiator 160 is an electrically-triggered pyrotechnic device containing pyrotechnic material that is triggered upon receiving a signal from an impact detection system. The initiator 160 may have a body 164 coupled to the connection member 120. The body 164 may be a channel section that allows for communication of a pressure increase or shock wave to the connection member. The body 164 may be an empty channel or may include booster material 168 to supplement the initiator 160. Booster material 168 may be required in an inflator 100 employing multiple burst disks 142, 144. Depending upon the embodiment of the vessels 112, 116 employed, the initiator 160 functions to transition the ejection orifices 124, 128 and the inflator 100 from a sealed configuration to an open configuration. The open configuration allows the gases or gas generants 148, 152 to produce an inflation gas that is ejected from the inflator 100 and into an airbag such as an inflatable curtain.

In an inflator 100 embodiment that employs burst disks 142, 144, the open configuration of the vessels 112, 116 is achieved by the initiator 160 igniting a pyrotechnic or other similar charge. Upon receiving an initiation signal, the initiator 160 triggers a pyrotechnic charge. The force and pressure generated by the pyrotechnic charge travels through the body 164 of the initiator 160 and into the connection member 120. The connection member burst disks 144 are configured to respond to a pressure increase or shock wave such that the connection member burst disks 144 are opened. To assist in opening the connection member burst disks 144, the connection member 120 may contain a gas, liquid, or other pressurizable material to provide an additional biasing force against the connection member burst disks 144. However, the material in the connection member 120 may simply be a byproduct of the pyrotechnic charge in the initiator.

As the pressure increases within the connection member 120, the force applied on the connection member burst disks 144 will cause the connection member burst disks 144 to deflect. Once the connection member burst disks 144 deflect to a selective size, the connection member burst disks 144 will pass through the connection member orifices 146, 147. Where large connection member burst disks 144 are employed, booster material 168 may be required to ensure opening of the connection member burst disks 144.

Once the connection member burst disks 144 are opened, the pressure generated by the initiator 160 in the connection member 120 will cause the pressure of the gases or gas generants 148, 152 in the vessels 112, 116 to increase. This increased pressure within the vessels 112, 116 may be caused by the injection of a high pressure gas or liquid in the connection member 120 entering the vessels 112, 116. As the pressure within the vessels 112, 116 increases, the ejection orifice burst disks 142 are configured to deflect and pass through the ejection orifices 124, 128. Once the ejection orifice burst disks 142 are open, the gas may freely exit the vessels 112, 116 and travel into the inlet ports of an inflatable curtain.

In order for the gas or liquid within the connection member 120 to increase the pressure within the vessels 112, 116, the pressure within the connection member 120, after the initiator 160 is triggered, should be higher than the pressure within the two vessels 112, 116. If the pressure in the connection member 120 is higher than the pressure within the vessels 112, 116, the net pressure within the two vessels 112, 116 will increase. The pressure within the connection member 120 and within the vessels 112, 116 may be generated by the force of the pyrotechnic material forcing away from the pyrotechnic source, the initiator 160. The material being forced away by the pyrotechnic will apply compressive forces on the material that is positioned outward of the initiator 160, such that the pressure within the vessels 112, 116 increases to open the ejection orifice burst disks 142.

As the pressure within the connection member 120 is applied to the material within the vessels 112, 116, it may be desirable for the pressure within the connection member 120 to be sufficient to prevent the gases or gas generants 148, 152 within the vessels 112, 116 from flowing backward toward the connection member 120. By forcing the gases or gas generants 148, 152 outward from the connection member 120, the gases or gas generants 148, 152 from the two vessels 112, 116 will not mix significantly with each other. Thus, the selection of gases or gas generants 148, 152 and the other deployment characteristics of the individual vessels 112, 116 may be maintained.

The inflator 100 may also incorporate methods of opening the ejection orifice burst disks 142, other than by increasing the pressure of the gases or gas generants 148, 152. In one embodiment, a shock wave created by the initiator 160 causes the burst disks 142, 144 to open. Because the source of the shock wave is the centrally-located initiator 160, the shock wave will travel outward from the initiator 160. The outward motion of the shockwave from the initiator 160 will cause the connection member burst disks 144 to open first, followed by the ejection orifice burst disks 142.

In another configuration, the connection member 120 may contain a chemical or a catalyst that interacts with the gases or gas generants 148, 152. When the connection member burst disks 144 are open, the chemical or catalyst in the connection member 120 will cause a chemical reaction with the gases or gas generants 148, 152, creating an inflation gas. The gas created by the chemical reaction increases the pressure within the sections 112, 116 and opens the ejection orifice burst disks 142.

Other embodiments may not open the connection member burst disks 144 or may exclude the connection member burst disks 144 altogether. Instead, a shock wave created by the initiator 160 would travel through the inflator 100 and open the ejection orifice burst disks 142. In such an inflator 100, there is no need to open the connection member burst disks 144 or other similar barrier between the vessels 112, 116 and the connection member 120.

In yet another variation, toggling disks may be used in place of the connection member burst disks 144. The toggling disks would appear similar to the connection member burst disks 144. The toggling disks are dome-shaped disks that are bowed inward toward the connection member 120, in the same manner as the connection member burst disks 144 illustrated in FIG. 1.

The toggling disks are configured to toggle from being bowed inward toward the connection member 120 to being bowed outward from the connection member 120. As the toggling disks become bowed outward from the connection member 120 and bow inward toward the vessels 112, 116, the toggling disks decrease the volume of the vessels 112, 116, causing the gases or gas generants 148, 152 in the vessels 112, 116 to be compressed. The compression of the gases or gas generants 148, 152 increases pressure in the vessel 112, 116 sufficient to open the ejection orifice burst disks 142.

Figure 2:
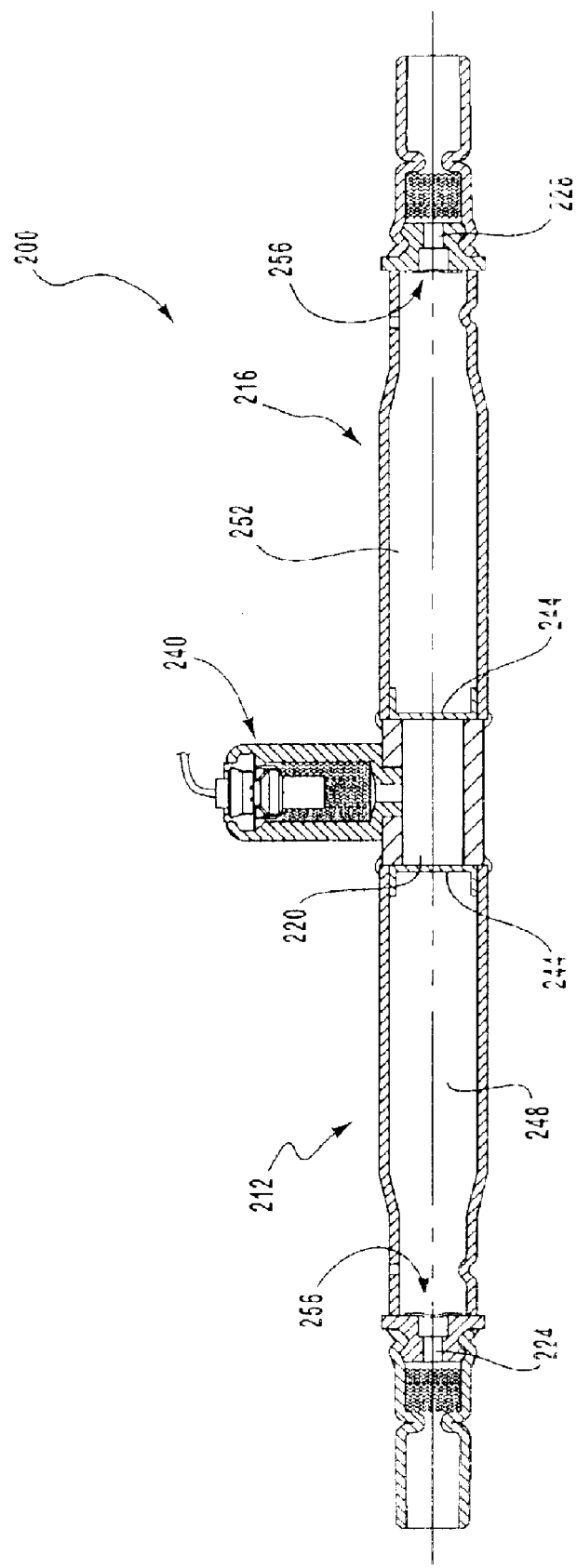
FIG. 2 is a cross-sectional view of an alternative embodiment of an inflator employing displaceable pistons.

FIG. 2 illustrates another embodiment for opening ejection orifice burst disks 256. The inflator 200 has two displaceable pistons 244 separating the first vessel 212 and the second vessel 216 from the connection member 220. The inflator 200 operates as the initiator 240 ignites a pyrotechnic, creating a high pressure or shock wave within the connection member 220. Similar to previous inflator 100 configurations, the pressure within the connection member 220 increases to a magnitude that is higher than the pressure within the two vessels 212, 216. The pressure differential between the connection member 220 and the two vessels 212, 216, is caused by the pyrotechnic that biases the displaceable pistons 244 away from the connection member 220. As the displaceable pistons 244 are projected away from the connection member 220, the gases or gas generants 248, 252 compress, increasing the pressure of the gases or gas generants 248, 252 within the vessels 212, 216. The pressure increases until the pressure within the vessels 212, 216 is sufficient to open the ejection orifice burst disks 256.

The displaceable pistons 244 are illustrated in FIG. 2 as being C-shaped sections, where the C-shaped section opens away from the connection member 220. However, the displaceable pistons 244 may have any number of shapes. For example, the displaceable pistons 244 may be a solid rectangular shape. Alternatively, the displaceable pistons 244 may be C-shaped sections that open toward the connection member 220.

The use of displaceable pistons 244 and toggling disks provide some advantages over burst disks 144 of FIG. 1. One advantage is the ability to segregate different gases or gas generants 248, 252 between the first vessel 212, the second vessel 216, and the connection member 220. In some inflators 100, 200, it may be desirable not to mix the gases or gas generants 148, 152, 248, 252 within the different sections of the inflator 100, 200. By using a displaceable piston 244 or a toggling disk, no fluid communication exists between the different sections of the inflator 100, 200. Additionally, the segregation between the vessels 112, 116, 212, 216 and the connection member 120, 220 allows for highly controllable quantities of gas to be ejected from the ejection orifices 124, 128, 224, 228 without gas flowing backward and ejecting out the opposing orifice 124, 128, 224, 228.

Referring back to FIG. 1, the inflator 100 is illustrated as being a generally elongated device where the first vessel 112 and the second vessel 116 are positioned such that the ejection orifices 124, 128 are on a single axis. However, other configurations of the inflator 100 are possible. In another configuration, the first vessel 112 and second vessel 116 are positioned such that the inflator 100 is generally V-shaped or L-shaped. The relative positioning of the two vessels 112, 116 may have several functions in the placement and operation of the inflator 100.

One function is the positioning of the inflator 100 within the automobile. Often, inflators 100 are located in generally small and tight locations within the automobile. In such tightly constrained locations, the position of the vessels 112, 116 relative to one another may need to be angled in order to allow placement of the inflator 100 in the desired location. For example, the relative position of the two vessels 112, 116 may be adjusted such that the inflator 100 may be placed at the junction between a front support beam and a roof rail. In such a configuration the two vessels 112, 116 may be angled to conform to this junction.

Another function of positioning the first vessel 112 and the second vessel 116 at an angle relative to one another is the ability to accommodate differently positioned inflatable curtains. Inflatable curtains may be positioned at different locations throughout an automobile. In some configurations, two inflatable curtains may not be positionable such that an elongated inflator, as illustrated in FIG. 1, may attach to each of the inflatable curtains. In such an inflatable curtain configuration, it may be desirable for the first vessel 112, and the second vessel 116 to be positioned at an angle relative to one another to attach to both inflatable curtains.

Figure 3:
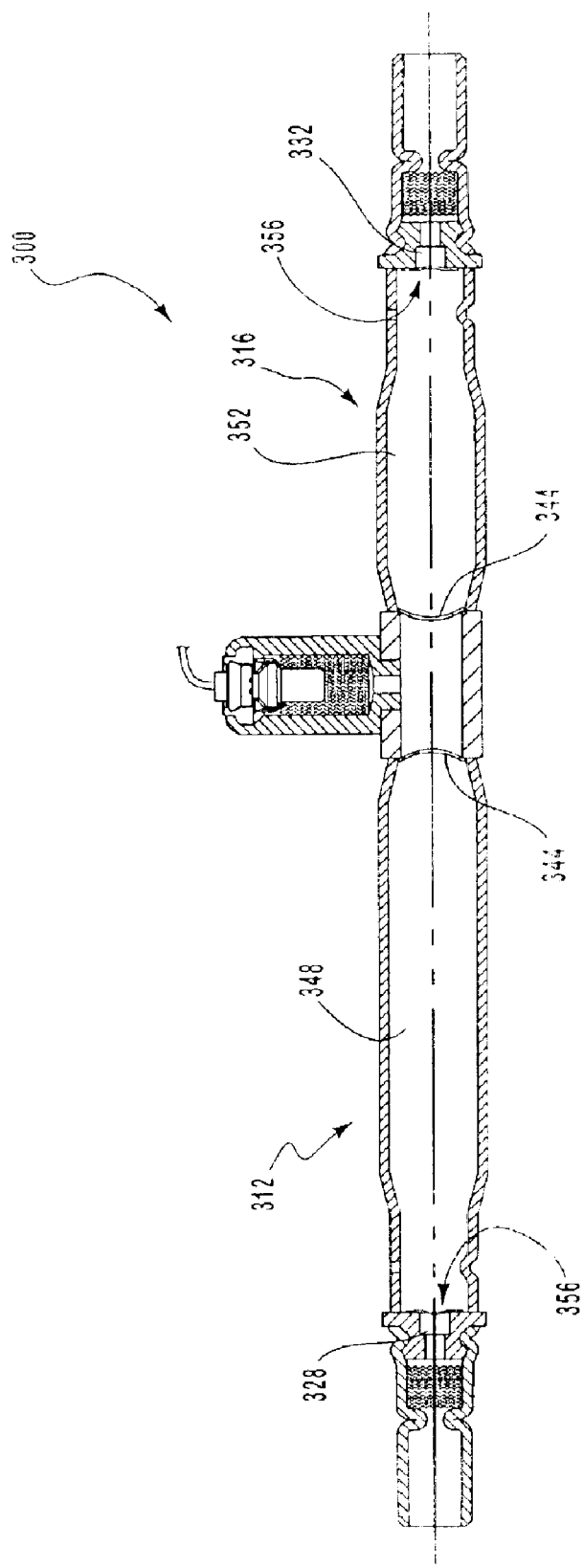
FIG. 3 is a cross-sectional view of another embodiment of an inflator having two differently sized vessels.

In addition to being capable of varying the attachment of the first vessel 112 and the second vessel 116 to the connection member 120, the inflator 100 may also incorporate differently-sized vessels 112, 116. Referring now to FIG. 3, an inflator 300 having a first vessel 312 and a second vessel 316 is illustrated, where the first vessel 312 is larger than the second vessel 316. The first vessel 312 may be larger than the second vessel 316 in volume, in length, or in a combination of the two.

The use of two differently-sized vessels 312, 316 provide several advantages for the inflator 300. One advantage is the ability to control the flow rate of the gases or gas generants 348, 352 ejecting from the inflators 300. For example, if the first vessel 312 and the second vessel 316 contained the same gases or gas generants 348, 352, but the first vessel 312 is larger than the second vessel 316, then the first vessel 312 would have a larger gas flow rate than the second vessel 316. The larger gas flow rate would be produced by a larger amount of gas in the first vessel 312 compared to the second vessel 316. Thus, the size of the vessels 312, 316 may be selected according to the desired gas flow.

Furthermore, the use of differently sized vessels 312, 316 may also allow the size of the inflator 300 to be adjusted in order to accommodate placement within an automobile without varying the volume. For example, placement of inflators 300 in a generally small location may require that the length of one of the vessels 312, 316 be reduced. The length of one of the vessels 312, 316 is reduced and the diameter of the same vessel 312, 316 is increased to maintain the same volume between the two vessels 312, 316. In such a configuration, the volumes of the two vessels 312, 316 are the same, but the lengths of the two vessels 312, 316 are different.

Additionally, the individual characteristics of the two vessels 312, 316 may also vary. For example, the size of the ejection orifices 328, 332 may be different between the first vessel 312 and the second vessel 316. Also, the type of sealing mechanisms, such as burst disks 344, 356, toggling disks, scored surfaces, displaceable pistons, etc., may differ between the two vessels 312, 316. Generally, any feature that may be varied from inflator to inflator may also be varied between the vessels 312, 316.

The inflator 300 of FIG. 3 demonstrates one advantage of the present inflator 300, which is the ability to vary the two vessels 312, 316. As was discussed above, the two vessels 312, 316 may have different sizes and volumes according to the required operation of the inflator 300. Similarly, the gases or gas generants 348, 352 may vary between the two vessels 312, 316. The ability to vary the gases or gas generants 348, 352 within the vessels 312, 316 allows the gas or gas generant 348, 352 characteristics of each vessel 312, 316 to be selected according to the inflatable curtain to which each vessel 312, 316 is attached via inlet ports.

Furthermore, the system for maintaining the gases or gas generants 348, 382 within the vessels 312, 316, i.e. the burst disks, displaceable pistons, or toggling disks, may be varied between the vessels 312, 316. The ability to vary the individual features of the vessels 312, 316 provides a high degree of control over the design of any of the inflators 100, 200, 300 illustrated. Thus, an inflator 100, 200, 300 may be designed for specific inflatable curtain configurations.

Figure 4:
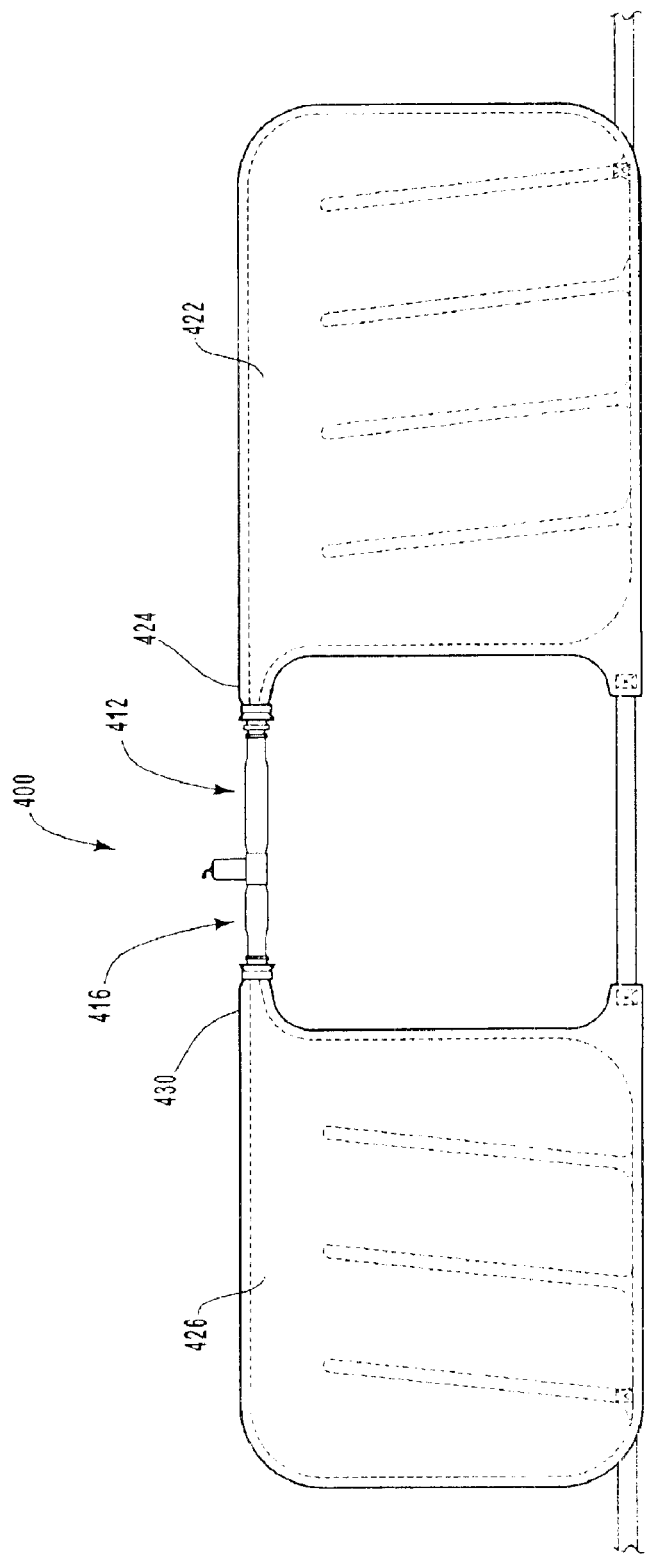
FIG. 4 is a side view of the inflator of FIG. 3 attached to two inflatable curtains.

Referring now to FIG. 4, an inflator 400 having two differently-sized vessels 412, 416 is illustrated. The first vessel 412 is attached to a first inflatable curtain 422 through a first inlet port 424 and the second vessel 416 is attached to a second inflatable curtain 426 through a second inlet port 430. As discussed previously, the inflator 400 provides the ability to configure the individual vessels 412, 416 to differently sized inflatable curtains 422, 426. As illustrated in FIG. 4, the first inflatable curtain 422 is larger than the second inflatable curtain 426. Thus, the first inflatable curtain 422 requires a larger flow of inflation gas than is required to inflate the second inflatable curtain 426.

In order to accommodate the different-sized inflatable curtains, 422, 426, an inflator 400 is provided where the first vessel 412 is larger than the second vessel 416. The size of the first vessel 412 may be sized according to the volume of the first inflatable curtain 422 and the size of the second vessel 416 may be sized according to the volume of the second inflatable curtain 426. Thus, the inflator 400 may simultaneously inflate two differently sized inflatable curtains 422, 426.

An inflator 400 having two differently-sized vessels 412, 416 may be employed in various inflatable curtain configurations. An inflatable curtain unit may be comprised of two separate inflatable curtains 422, 426 that inflate into two separate cushions. However, the two inflatable curtains 422, 426 may be part of a single cushion that receives inflation gas through two inlet ports 424, 430. The single cushion could allow for fluid communication between the first inflatable curtain 422 and the second inflatable curtain 426, even though the inlet ports 424, 430 are receiving inflation gas from two separate vessels 412, 416. Such a configuration could be used to evenly inflate a large cushion when the inflator 400 is offset from the center of the cushion.

For example, an inflatable curtain unit having a single cushion that is three feet long, but having an inflator that is positioned one foot from one of the ends may require two separately sized vessels 412, 416 in the inflator 400. The separately sized vessels 412, 416 provide a large gas flow into the two foot long side of the cushion unit and the small gas flow into the one foot long side of the cushion. Thus, both sides of a single cushion, i.e. two inflatable curtains, can simultaneously inflate through two separate flows of inflation gas.

Alternatively, the first inflatable curtain 422 and the second inflatable curtain 426 may be similarly sized, but each may be attached to an inflator having two differently-sized vessels 412, 416. The two different sized vessels 412, 416 of the inflator 400 may inflate the inflatable curtains 422, 426 at different pressures.

Multiple other variations of the inflatable curtains 422, 426 may be possible in association with the inflator 400 of the present invention. Generally, the inflator 400 is capable of producing two independently controlled flows of inflation gas, where the characteristics of a gas flow may vary in much the same manner as the gas flow from two separate inflators.

Referring back to FIG. 1, the use of separate similarly sized vessels 112, 116 may be capable of providing two separate flow rates of gas from similarly sized vessels 112, 116. In one embodiment, different quantities of the same inflation gas or gas generants 148, 152 may be present in each of the vessels 112, 116. Alternatively, two separate gases or gas generants 148, 152 may be present in the two vessels 112, 116. The two different gases or gas generants 148, 152 may inflate two separate inflatable curtain volumes with similar amounts of gases or gas generants 148, 152.

A further benefit of the inflator 100 is the ability to produce a substantially thrust neutral or reduced thrust inflator 100. When inflation gas exits from the ejection orifices 124, 128, thrust is produced. Thrust from a single orifice 124, 128 will tend to drive the inflator 100 in the direction opposite the flow of the gas. However, the inflator 100 illustrated in FIG. 1 ejects two flows of gas in substantially opposite directions. If the flow rate of gas is substantially equal, the inflator 100 will be substantially thrust neutral.

As previously discussed, a thrust is generated by gas ejecting from the ejection orifices 124, 128. Thrust is a function of the mass and velocity of the gas ejecting through the ejection orifices 124, 128. If the velocity or mass of one flow of gas is different then the velocity or mass of the other flow of gas, then the inflator 100 may not be substantially thrust neutral.

However, the use of two separate vessels 112, 116 may be configured to produce a substantially thrust neutral inflator 100 capable of inflating two inflatable curtains having different volumes. The substantially thrust neutral inflator may be created by employing two different gas generants 148, 152 in each of the vessels 112, 116. By selecting two different gas generants 148, 152 according to the different molecular weights, the inflator 100 may inflate two differently sized volumes, while remaining substantially thrust neutral.

In selecting a substantially thrust neutral inflator 100, the mass of gases or gas generants 148, 152 should be selected such that the mass of the first gas generant 148 is equal to the mass of the second gas or gas generant 152. The thrust of a gas ejecting from an inflator 100 is proportional to the mass of the gas ejecting from the inflator 100. If the masses and velocities of the ejecting gas are the same, then the thrust created by the ejecting gas will also be the same, regardless of the gases having different volumes.

Generally, the volume of a gas is a function of the number of moles of the gas. Because both vessels 112, 116 in the inflator are exposed to the same ambient conditions, the temperature of the two gases or gas generants 148, 152 in the vessels 112, 116 will be generally similar. Thus, the temperatures of both gases or gas generants 148, 152 will change equally and will not be a significant factor in the selection of the gases or gas generants 148, 152.

For similar reasons, the pressure of the gas ejected into inflatable curtains may not be a significant factor in the selection of the gases or gas generants 148, 152. Pressure and volume are proportional to one another. As the volume of an inflatable curtain having a fixed amount of gas is increased, the pressure will decrease. Conversely, as the volume of an inflatable curtain having a fixed amount of gas is decreased, the pressure will increase.

While the pressure and volume relationship of a gas can make simple volume to molecular mass comparisons difficult, the assumption that the pressures are equal in the two separate inflatable curtains is preferably used. This assumption may be useful for convenience purposes, because pressure and volume will vary depending upon the type of inflatable curtain. However, this discussion is intended to illustrate how the molecular masses of two gases or gas generants 148, 152 relate to the volume of two inflatable curtains. Therefore, if the pressure and temperature of the inflation gas in two inflatable curtains is the same, the volume of a gas will be directly proportional to the number of moles of the gas or gas generant 148, 152 inflating the inflatable curtain.

In selecting a first gas or gas generant 148 and a second gas or gas generant 152 to inflate two inflatable curtains having different volumes, the proportion between the volumes of the inflatable curtains should be identified. By way of example, assume that the first inflatable curtain is four cubic feet and the second inflatable curtain is two cubic feet. Because the first inflatable curtain is twice the size of the second inflatable curtain, the first inflatable curtain will also have twice the number of moles of gas compared to the second inflatable curtain.

In order for the mass of the first gas or gas generant 148 in the first inflatable curtain to be equal to the mass of the second gas or gas generant 152 in the second inflatable curtain, the molecular weight of the second gas or gas generant 152 must be twice the molecular weight of the first gas or gas generant 148. The mass of a gas is equal to the number of moles multiplied by the molecular weight of the gas. Thus, the mass of two separate gases or gas generants 148, 152 having a different number of moles, may be equal if one gas generant 152 has a larger molecular weight than the other gas or gas generant 148.

If the first gas or gas generant 148 has twice the number of moles of the second gas or gas generant 152, then the molecular weights of the second gas or gas generant 152 should be twice the molecular weight of the first gas or gas generant 148 to provide for equal masses of gas in each inflatable curtain. By selecting two different gases or gas generants 148, 152 that have a molecular weight that is proportional to the difference in volumes between their respective inflatable curtains, the masses of the two gases or gas generants 148, 152 may be equal. Furthermore, while the masses of the two gases or gas generants 148, 152 may be equal, the volumes of the associated inflatable curtains may be different. Thus, the gas generants selected for use in the individual vessels of the inflator may be chosen such that the ratio of the molecular weight of a gas produced by the first vessel gas generant to the molecular weight of a gas produced by the second vessel gas generant is inversely proportionate to the ratio of the volume of the gas produced by the first vessel gas generant to the volume of the gas produced by the second vessel gas generant.

By selecting gases or gas generants 148, 152 according to molecular weights that are proportional to the difference in volume of the individual inflatable curtains, a substantially thrust neutral inflator 100 may be created that inflates two differently sized inflatable curtains. Thus, the selective use of two different gases or gas generants 148, 152 may provide the ability to control the thrust and inflation of various inflatable curtains.

While different gases or gas generants 148, 152 and different vessel 112, 116 characteristics may be applied to a single inflator 100, any one variation requires a completely different inflator 100. In order to provide an inflator 100 that may easily be varied depending upon the various applications, the inflator 100 may be created by a modular inflator system.

Figure 5:
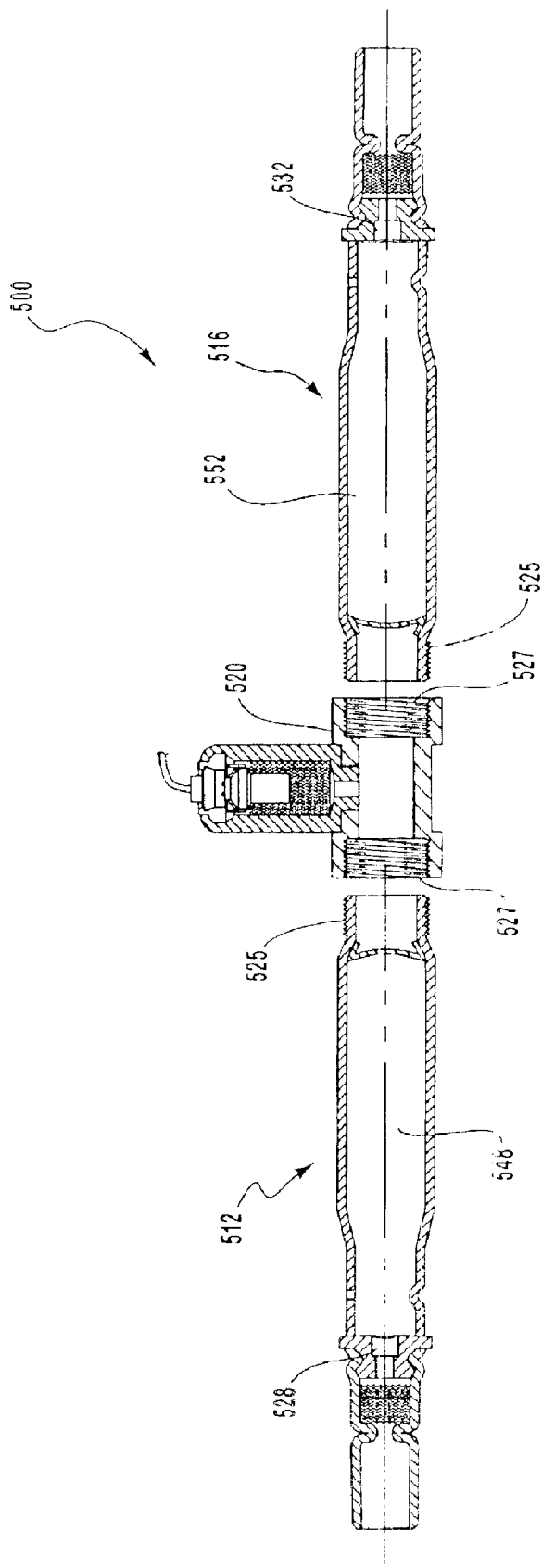
FIG. 5 is a cross-sectional view of a modular inflator system according to yet another embodiment of the invention.

Referring now to FIG. 5, a modular inflator system 500 is illustrated. The modular inflator system 500 has a first vessel 512, a second vessel 516, and a connection member 520. The first vessel 512 may be selected from a first group of vessels having various gas ejection characteristics. Similarly, the second vessel 516 may be selected from a second group of vessels having various gas ejection characteristics.

The first group of vessels and the second group of vessels may be groups of modules having different volumes, sizes, lengths, gases or gas generants 548, 552, ejection orifices 528, 532, etc. The first group of vessels and the second group of vessels may be the same group of modules, where selective vessels 512, 516 are chosen depending upon the desired application.

The use of a modular inflator system 500 allows for a large number of inflator 500 configurations to be created, by manufacturing a few components. For example, if the group of vessels includes three different types of vessels, then nine different inflator configurations may be created from four distinct components, including the connection member 520. The modular inflator system 500 may reduce the number of manufacturing lines required to build an inflator. Thus, the inflator can be inexpensively and easily manufactured for an individual automobile, without incurring the high costs of creating a new manufacturing line.

The vessels 512, 516 may be attachable to the connection member 520 through various structures. In one configuration, the vessels 512, 516 may employ threaded ends 525, either male or female. The connection member 520 may include corresponding threaded ends 527. The vessels 512, 516 could then be simply screwed onto the connection member 520, allowing a large number of inflator module 500 configurations to be created with a relatively small number of standard parts. One of skill in the art would understand that the vessels 512, 516 may be attached to the central portion 520 using a wide variety of methods, including, but not limited to, mating threaded ends, crimping, welding, or brazing.

Alternatively, the vessels 512, 516 may have detent attachment members (not shown) with corresponding detent attachment members on the connection member 520. The detent attachment members may allow for the vessels 512, 516 to slidably attach together. Additionally, the direction of the thrust produced by the gas ejecting from the vessels 512, 516 will force the vessels 512, 516 into further engagement with the connection member 520. Thus, the attachment of the vessels 512, 516 to the connection member 520 does not generally require a complex attachment mechanism.

While various other embodiments of the dual vessel inflator are possible, the inflator is generally comprised of a first vessel and a second vessel coupled together by a connection member. The use of two vessels allows the vessels to be independently configurable to provide a controllable ejection of inflation gas form the inflator. The connection member may attach to the first vessel and the second vessel such that the vessels are positioned in substantially opposite directions. The substantially opposite directions allow the inflator to be substantially thrust neutral, allowing for a simplified attachment mechanism for the inflator.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed and desired to be secured by United States Letters Patent is:

1. An airbag inflator comprising:
    a first vessel having a first end and a second end, wherein the first vessel has an ejection orifice at the first end;
    a second vessel having a first end and a second end, wherein the second vessel has an ejection orifice at the first end;
    a connection member coupled to the second end of the first vessel and to the second end of the second vessel, such that the first vessel is not in fluid communication with the second vessel, wherein the ejection orifice of the first vessel is oriented to eject gas in a direction generally opposite to the ejection orifice of the second vessel.

2. The airbag inflator as recited in claim 1, wherein the first vessel has a size different from the size of the second vessel.

3. The airbag inflator as recited in claim 1, wherein the first vessel has a first gas generant to produce a first volume of gas, and the second vessel has a second gas generant to produce a second volume of gas.

4. The airbag inflator as recited in claim 3, wherein the first gas generant is different from the second gas generant.

5. The airbag inflator as recited in claim 4, wherein the first and second gas generants are selected such that the ratio of the molecular weight of a gas produced by the first gas generant to the molecular weight of a gas produced by the second gas generant is inversely proportionate to the ratio of the volume of the gas produced by the first gas generant to the volume of the gas produced by the second gas generant.

6. The airbag inflator as recited in claim 3, wherein the first gas generant and the second gas generant are selected such that the inflator is substantially thrust neutral.

7. The airbag inflator as recited in claim 6, wherein the first gas generant and the second gas generant are selected such that the molecular masses of the gas generants are substantially equal.

8. The airbag inflator as recited in claim 3, wherein the first vessel has a different quantity of gas generant than the second vessel.

9. The airbag inflator as recited in claim 1, wherein the inflator is substantially thrust neutral.

10. The airbag inflator as recited in claim 1, wherein the first vessel ejection orifice and the second vessel ejection orifice are substantially coaxial.

11. The airbag inflator as recited in claim 1, wherein the first vessel ejection orifice and the second vessel ejection orifice are oriented such that the inflator is substantially thrust neutral along one axis.

12. The airbag inflator as recited in claim 1, further comprising:
    a first connection member burst disk positioned at the second end of the first vessel; and
    a second connection member burst disk positioned at the second end of the second vessel.

13. The airbag inflator as recited in claim 12, wherein the first and second connection member burst disks each include a convex deflection into the connection member.

14. The airbag inflator as recited in claim 1, further comprising:
    a first toggling disk positioned at the second end of the first vessel wherein the first toggling disk bows inwardly toward the connection member; and
    a second toggling disk positioned at the second end of the second vessel, wherein the second toggling disk bows inwardly toward the connection member.

15. The airbag inflator as recited in claim 1, further comprising an initiator in communication with the connection member.

16. The airbag inflator as recited in claim 1, further comprising:
    a first displaceable piston positioned at the second end of the first vessel; and
    a second displaceable piston positioned at the second end of the second vessel.

17. The airbag inflator as recited in claim 1, wherein the first end of the first vessel is coupled to a first inflatable curtain and the first end of the second vessel is coupled to a second inflatable curtain such that the airbag inflator may expel inflation gas into the first and second inflatable curtains.

18. The airbag inflator as recited in claim 17, wherein the first inflatable curtain is a first cushion and the second inflatable curtain is a second cushion.

19. The airbag inflator, as recited in claim 17, wherein the first inflatable curtain and the second inflatable curtain are portions of a single cushion.

20. The airbag inflator, as recited in claim 19, wherein the first inflatable curtain and the second inflatable curtain are not in fluid communication with each other.

21. The airbag inflator, as recited in claim 17, wherein the first inflatable curtain and the second inflatable curtain are different sizes.

22. The airbag inflator, as recited in claim 21, wherein the first vessel is selected to inflate the first inflatable curtain and the second vessel is selected to inflate the second inflatable curtain.

23. The airbag inflator, as recited in claim 21, wherein the first vessel includes a first gas generant selected according to the volume of the first inflatable curtain and wherein the second vessel includes a second gas generant selected according to the volume of the second inflatable curtain.

24. The airbag inflator, as recited in claim 23, wherein the first and second gas generants are selected such that the ratio of the molecular weight of a gas produced by the first gas generant to the molecular weight of a gas produced by the second gas generant is inversely proportionate to the ratio of the volume of the gas produced by the first gas generant to the volume of the gas produced by the second gas generant.

25. The airbag inflator, as recited in claim 17, wherein the first inflatable curtain and the second inflatable curtain are similar in size.

26. The airbag inflator, as recited in claim 17, wherein the first inflatable curtain and the second inflatable curtain are not in fluid communication with each other.

27. An airbag inflator comprising:
a first vessel having a first end and a second end, the first end including an ejection orifice, wherein the second end of the first vessel is sealed by a burst disk;
a second vessel having a first end and a second end, the first end including an ejection orifice, wherein the second end of the second vessel is sealed by a burst disk;
a connection member coupled to the second end of the first vessel and to the second end of the second vessel, wherein the ejection orifice of the first vessel is oriented to eject gas in a direction generally opposite to the ejection orifice of the second vessel; and
an initiator coupled to the connection member.

28. The airbag inflator as recited in claim 27 wherein the first vessel is a different size than the second vessel.

29. The airbag inflator as recited in claim 27, wherein the first vessel has a first gas generant and the second vessel has a second gas generant.

30. The airbag inflator as recited in claim 29, wherein the first gas generant is different from the second gas generant.

31. The airbag inflator as recited in claim 30, wherein the first and second gas generants are selected such that the ratio of the molecular weight of a gas produced by the first gas generant to the molecular weight of a gas produced by the second gas generant is inversely proportionate to the ratio of the volume of the gas produced by the first gas generant to the volume of the gas produced by the second gas generant.

32. The airbag inflator as recited in claim 29, wherein the first gas generant and the second gas generant are selected such that the inflator is substantially thrust neutral.

33. The airbag inflator as recited in claim 32, wherein the gas generant of the first vessel and the gas generant of the second vessel are selected such that the molecular masses of the gas generants are substantially equal.

34. The airbag inflator as recited in claim 29, wherein the first vessel has a different quantity of gas generant than the second vessel.

35. The airbag inflator as recited in claim 27, wherein the inflator is substantially thrust neutral.

36. The airbag inflator as recited in claim 27, wherein the first vessel ejection orifice and second vessel ejection orifice are substantially coaxial.

37. The airbag inflator as recited in claim 27, wherein the ejection orifice of the first vessel and the ejection orifice of the second vessel are oriented such that the inflator is substantially thrust neutral along one axis.

38. The airbag inflator as recited in claim 27, further comprising:
a first burst disk positioned at the first end of the first vessel; and
a second burst disk positioned at the first end of the second vessel.

39. The airbag inflator as recited in claim 27, wherein the burst disks at the second ends of the first and second vessels bow inwardly toward the connection member.

40. The airbag inflator as recited in claim 27, wherein the first end of the first vessel is coupled to a first inflatable curtain and the first end of the second vessel is coupled to a second inflatable curtain.

41. The airbag inflator as recited in claim 40, wherein the first inflatable curtain is a first cushion and the second inflatable curtain is a second cushion.

42. The airbag inflator as recited in claim 40, wherein the first inflatable curtain and the second inflatable curtain are portions of a single cushion.

43. The airbag inflator as recited in claim 42, wherein the first inflatable curtain and the second inflatable curtain are not in fluid communication with each other.

44. The airbag inflator as recited in claim 40, wherein the first inflatable curtain and the second inflatable curtain are different sizes.

45. The airbag inflator as recited in claim 44, wherein the first vessel is selected to inflate the first inflatable curtain and the second vessel is selected to inflate the second inflatable curtain.

46. The airbag inflator as recited in claim 44, wherein the first vessel has a first gas generant selected to inflate the volume of the first inflatable curtain and the second vessel has a second gas generant selected to inflate the volume of the second inflatable curtain, wherein the airbag inflator is substantially thrust neutral.

47. The airbag inflator as recited in claim 46, wherein the first and second gas generants are selected such that the ratio of the molecular weight of a gas produced by the first gas generant to the molecular weight of a gas produced by the second gas generant is inversely proportionate to the ratio of the volume of the gas produced by the first gas generant to the volume of the gas produced by the second gas generant.

48. The airbag inflator as recited in claim 40, wherein the first inflatable curtain and the second inflatable curtain are similar in size.

49. The airbag inflator as recited in claim 40, wherein the first inflatable curtain and the second inflatable curtain are not in fluid communication with each other.

50. The airbag inflator as recited in claim 49, wherein the first and second vessels include first and second gas generants selected such that the ratio of the molecular weight of a gas produced by the first gas generant to the molecular weight of a gas produced by the second gas generant is inversely proportionate to the ratio of the volume of the gas produced by the first gas generant to the volume of the gas produced by the second gas generant.

51. A method for assembling a modular inflator system comprising:
selecting a first vessel from a first group of vessels, wherein the first vessel has a first end and a second end, wherein the first vessel has an ejection orifice at the first end;
selecting a second vessel from a second group of vessels, wherein the second vessel has a first end and a second end, wherein the second vessel has an ejection orifice at the first end; and
attaching a connection member to the second end of the first vessel and to the second end of the second vessel, such that the ejection orifice of the first vessel is oriented to eject gas in a direction generally opposite to the ejection orifice of the second vessel.

52. The method for assembling a modular inflator system as recited in claim 51, wherein the second end of the first vessel and the second end of the second vessel are threadably attached to the connection member.

53. The method for assembling a modular inflator system as recited in claim 51, wherein the first vessel and the second vessel are different sizes.

54. The method for assembling a modular inflator system as recited in claim 51, wherein the first vessel and the second vessel are the same size.

55. The method for assembling a modular inflator system as recited in claim 51, wherein the first group of vessels and the second group of vessels are the same group of vessels.

56. The method for assembling a modular inflator system as recited in claim 51, wherein the first group of vessels and the second group of vessels each have vessels of varying sizes.

57. The method for assembling a modular inflator system as recited in claim 51, wherein the first group of vessels and the second group of vessels each have vessels of varying gas generants.

58. The method for assembling a modular inflator system as recited in claim 51, wherein the first vessel is selected to inflate a first inflatable curtain and the second vessel is selected to inflate a second inflatable curtain.

* * * * *